US010566969B2

(12) United States Patent
Costello (10) Patent No.: US 10,566,969 B2
(45) Date of Patent: Feb. 18, 2020

(54) ANALOG POWER-UP RESET CIRCUIT FOR LOGIC LEVEL RESET

(71) Applicant: Rolls-Royce Corporation, Indianapolis, IN (US)

(72) Inventor: John Joseph Costello, Indianapolis, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 0 days.

(21) Appl. No.: 16/025,468

(22) Filed: Jul. 2, 2018

(65) Prior Publication Data
US 2019/0068185 A1 Feb. 28, 2019

Related U.S. Application Data

(60) Provisional application No. 62/551,004, filed on Aug. 28, 2017.

(51) Int. Cl.
*H03K 17/22* (2006.01)

(52) U.S. Cl.
CPC ........... *H03K 17/223* (2013.01); *H03K 17/22* (2013.01)

(58) Field of Classification Search
CPC .. H03K 17/223; H03K 17/22; H03K 3/02335; H03K 3/0375; H03K 3/2865; H03K 3/356008; G06F 1/24
See application file for complete search history.

(56) References Cited

U.S. PATENT DOCUMENTS

| 4,254,347 A | 3/1981 | Ray |
| 4,994,689 A | 2/1991 | Kikuda et al. |
| 5,638,330 A * | 6/1997 | Confalonieri ............ G11C 7/22 327/143 |
| 6,204,703 B1 | 3/2001 | Kwon |
| 6,314,040 B1 | 11/2001 | Reynolds |
| 8,797,070 B2 | 8/2014 | Oka |
| 8,841,947 B2 | 9/2014 | Lin |

(Continued)

FOREIGN PATENT DOCUMENTS

EP 0150480 A2 8/1985

OTHER PUBLICATIONS

European Patent Office, Extended European Search Report for corresponding EP Application No. 18186261.6 dated Jan. 28, 2019, 9pgs.

(Continued)

*Primary Examiner* — Jung Kim
(74) *Attorney, Agent, or Firm* — Duane Morris LLP; Patrick Craig Muldoon (57) ABSTRACT

An electrical reset circuit is configured to generate a reset pulse to reset one or more electrical components. The electrical reset circuit includes a first device electrically connected between a power supply input and a first node. The first device is configured to conduct current after the power supply input reaches a first voltage threshold. The electrical reset circuit also includes a second device electrically connected between the power supply input and a second node, where the second device is configured to conduct current after the power supply input reaches a second voltage threshold. In some examples, the electrical circuit includes a delay circuit configured to delay the reset pulse. Corresponding methods to providing a reset pulse are also contemplated.

11 Claims, 6 Drawing Sheets

(56) References Cited

U.S. PATENT DOCUMENTS 9,018,989 B2    4/2015  Mandal et al.
2007/0001721 A1  1/2007  Chen et al.

OTHER PUBLICATIONS

Maxim Integrated, Application Note 3227, "Power-On Re-Set and Related Supervisory Functions," Jul. 8, 2004, 10pgs.
On Semiconductor, MC14013B, "Dual Type D Flip Flop," Mar. 2000, 8pgs.

* cited by examiner

ANALOG POWER-UP RESET CIRCUIT FOR LOGIC LEVEL RESET

CROSS-REFERENCE TO RELATED APPLICATION

This present application claims priority to U.S. Provisional Application No. 62/551,004, filed Aug. 28, 2017, first named inventor: John Joseph Costello, the entirety of which is hereby incorporated by reference.

FIELD OF THE DISCLOSURE

The present disclosure relates generally to electrical circuits, and, more specifically, to electrical reset circuits capable of providing reset signals.

BACKGROUND

Hardware, such as electrical equipment with digital components, often requires the setting or resetting of internal logic states. For example, during the initial energization or power-up sequence of electrical components, such as discrete gates or more complete integrated circuits, the logic states of those components must be set or reset to defined levels. This reset sequence is required to ensure that the components will function properly and as expected. In this manner, other system components, such as other gates or processors, can properly assume the startup state of the components.

Reset circuits can be used to reset electrical components. Reset circuits typically consist of simple resistor-capacitor (R-C) networks connected to a reset pin of each integrated circuit (IC). The reset circuits typically provide a reset pulse to each of the $IC_S$ via each IC's reset pin.

Figure 1A:
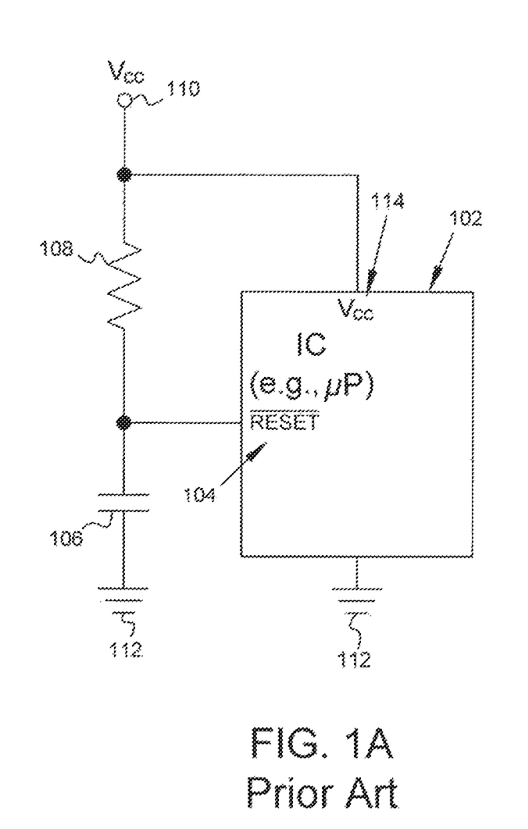
FIG. 1A is a schematic view of a prior art reset circuit for resetting an integrated circuit (IC) such as a microprocessor.

For example, FIG. 1A is a schematic view of a prior art reset circuit for resetting an IC 102 such as a microprocessor. The reset circuit includes resistor 108 and capacitor 106. Resistor 108 is electrically connected to power input $V_{CC}$ 110 and to reset input 104 of IC 102. Capacitor 106 is also electrically connected to reset input 104, as is also electrically connected to ground 112. Power input $V_{CC}$ 110 is electrically connected to the IC's $V_{CC}$ input 114, and IC 102 is also electrically connected to ground 112.

Figure 1B:
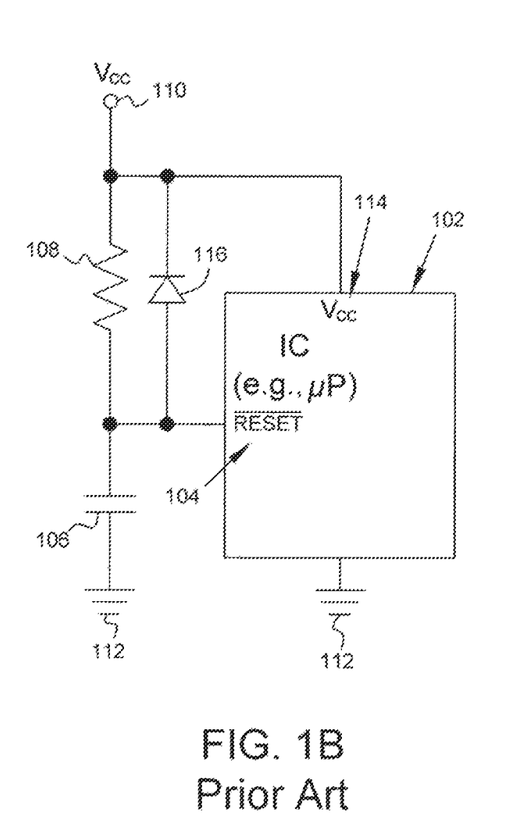
FIG. 1B is a schematic view of another prior art reset circuit for resetting an IC.

FIG. 1B shows another prior art example of a reset circuit for resetting an IC 102. Similar to FIG. 1A, FIG. 1B includes resistor 108 and capacitor 106. FIG. 1B, however, also includes diode 116, which as shown is electrically connected in parallel with resistor 108. As indicated in the figure, reset input 104 of IC 102 is electrically connected to diode 116, resistor 108, and capacitor 106.

Figure 2:
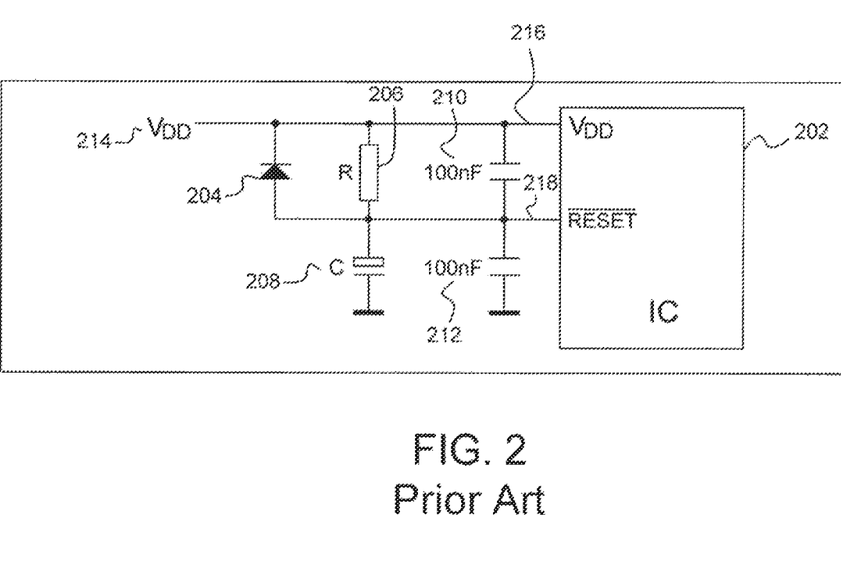
FIG. 2 is a schematic view of yet another prior art reset circuit for resetting an IC.

FIG. 2 shows yet another prior art example of a reset circuit. In this example, IC's 202 input $V_{DD}$ 216 is electrically connected to power input $V_{DD}$ 214. In addition, reset signal 218, which is electrically connected to reset input 218 of IC 202, is also connected to various other components of the reset circuitry including resistor 206, capacitor 208, diode 204, and inductors 210 and 212.

The prior art reset circuits of FIGS. 1A, 1B, and 2 include R-C networks with R-C time constants that, by changing the values of the R-C components, can be adjusted to provide a variable time period for reset activity to stabilize. Under normal (e.g., ideal) operating conditions, these circuits tend to work well. Under abnormal conditions, such as conditions with power transients, power interruptions, switching transients, or even brown-out conditions, however, these circuits behave differently and can negatively affect the logic states of logic gates within the digital devices (e.g., IC 102, 202). For example, these prior art reset circuits do not compensate for power transients during power-up, thus potentially leaving logic gates in unknown states at startup.

SUMMARY

The present application discloses at least the features recited in the appended claims and/or the following features which, alone or in any combination, may comprise patentable subject matter.

In some examples of the present disclosure, an electrical reset circuit is configured to generate a reset pulse. The reset pulse may be used to reset one or more electrical components, such as discrete gates, integrated circuits, processors, memory (e.g., such as random-access memory (RAM), read-only memory (ROM), erasable programmable read-only memory (EPROM), electrically erasable programmable read-only memory (EEPROM), etc.), or any other suitable electrical component, for example.

The electrical reset circuit includes a first device electrically connected between a power supply input and a first node. The first device is configured to conduct current after the power supply input reaches a first voltage threshold. The electrical reset circuit also includes a first resistor electrically connected between the first node and a common node, which, in some examples, is a ground connection. The electrical reset circuit also includes a second device electrically connected between the power supply input and a second node, where the second device is configured to conduct current after the power supply input reaches a second voltage threshold. For example, the second voltage threshold can be a higher voltage threshold than the first voltage threshold. In some examples, the first device and/or the second device are Zener diodes.

The electrical reset circuit further includes a first capacitor electrically connected between the second node and the common node, and a second resistor electrically connected in parallel with the first capacitor. The electrical reset circuit also includes at least two transistors. The first transistor is electrically connected between a power rail and the common node, where the gate of the first transistor is electrically connected to the first node. The power rail can be, for example a direct current (DC) power rail supplying a voltage, such as a voltage between 8 to 15 volts. The second transistor is electrically connected between the first node and the common node, where the gate of the second transistor is electrically connected to the second node. In some examples, the rest pulse is provided on a node between the power rail and the common node.

In some examples, the electrical reset circuit includes a third resistor electrically connected between the first device and the first node. The electrical reset circuit can also include a fourth resistor electrically connected between the second device and the second node, and in series with the first capacitor and the second resistor.

In some examples, the electrical reset circuit includes a third resistor electrically connected between the first transistor and the common node. The electrical reset circuit can also include a fourth resistor electrically connected between the power rail and the first transistor, where the fourth resistor, the first transistor, and the third resistor are electrically connected in series.

In some examples, the electrical reset circuit further includes a delay circuit electrically connected to the first transistor and configured to delay the reset pulse. For example, the delay circuit can delay the reset pulse in time.

The delay circuit can also increase the pulse width of the reset pulse. In some examples, the delay circuit includes at least two flip-flops. As recognized in the art, each flip-flop may have a data, set, reset, and clock input. In addition, each flip-flop may also include two output signals. In some examples, a set input of one flip-flop is electrically connected to the first transistor. For example, the set input of one flip-flop can be electrically connected to a node between the power rail and the common node where the rest pulse is provided.

In some examples, the delay circuit includes a third resistor electrically connected between an output of the first flip-flop and a clock input of the first flip-flop, and a second capacitor electrically connected between the output of the first flip-flop and the common node. The delay circuit can also include a diode electrically connected between an output of the second flip-flop and a reset input of the second flip-flop, and a third capacitor electrically connected between the reset input of the second flip-flop and the common node. The delay circuit can also include a fourth resistor electrically connected in parallel with the diode.

In some examples of the present disclosure, an electrical reset circuit, such as a transient sensitive power reset circuit, is provided. The electrical reset circuit includes a first circuit electrically connected between a power input and a ground. The first circuit includes a first device with a first resistance at a first voltage range and a second resistance at a second voltage range. For example, the first device can be a Zener diode that acts as an open circuit (e.g., a first resistance) before a voltage applied to the Zener diode reaches a threshold voltage. Once the threshold voltage is reached, the Zener diode begins to conduct current, offering a second resistance at voltages at or beyond the threshold voltage. The first circuit also includes a first resistor in series with the first device, where the first circuit has a first node between the first device and the first resistor.

The electrical reset circuit can also include a second circuit electrically connected between the power input and the ground and connected in parallel to the first circuit. The second circuit can include a second device with a third resistance at a third voltage range and a fourth resistance at a fourth voltage range. In some examples, the second device is a Zener diode. The second circuit can also include a second resistor electrically connected in parallel with a first capacitor, where the second device is electrically connected to the second resistor and the first capacitor at a second node.

The electrical circuit can include a first transistor electrically connected between a power rail and the ground, where the gate of the first transistor is responsive to a first voltage on the first node. The electrical circuit can also include a second transistor electrically connected between the first node and ground, where the gate of the second transistor is responsive to a second voltage on the second node. The electrical reset circuit can include a voltage output between the first transistor and ground where a delayed reset pulse may be provided.

The electrical circuit can also include a delay circuit. For example, the delay circuit can include a register having a first input, a second input, a first output, and a second output. The first input of the register can be electrically connected to the voltage output of the electrical circuit where the reset pulse can be provided as an input.

In some examples, the delay circuit includes a third resistor in series with a second capacitor, where the delay circuit has a third node between the second capacitor and the third resistor. The third node can be electrically connected to the second input of the register and the first output of the register.

In some examples, the second capacitor is electrically connected between the first output of the register and ground, and the first output of the register is electrically connected to the second input of the register. As such, an output of the register may be connected to an input of the register.

In some examples, the register of the delay circuit includes at least a first flip-flop and a second flip-flop, where the first input of the register is an input to the first flip-flop. In some examples, the second input of the register is a clock input to the second flip-flop, and the first output of the register is an output of the first flip-flop.

Corresponding methods are also contemplated. In one example method for generating a reset pulse, a power supply voltage is increased beyond a first voltage threshold on a power supply input to an electrical reset circuit. The electrical reset circuit includes at least a first device, a second device, a first transistor, and a second transistor, where the reset pulse is provided on a node electrically connected to the first transistor. The method further includes conducting, by the first device, a first current to activate the first transistor in response to the power supply voltage increasing beyond the first voltage threshold. In response to activating the first transistor, the method also includes providing a first voltage of the reset pulse on the node. For example, the first voltage may be 12 Volts.

The method further includes increasing the power supply voltage beyond a second voltage threshold on the power supply input and, in response to the power supply voltage increasing beyond the second voltage threshold, conducting, by the second device, a second current to activate the second transistor. The method also includes deactivating the first transistor in response to activating the second transistor. In response to deactivating the first transistor, the method further includes providing a second voltage of the reset pulse on the node. The second voltage can be a different voltage than the first voltage. For example, the second voltage may be 0 Volts.

In some examples, the method includes increasing the power supply voltage from the first voltage threshold to the second voltage threshold while maintaining an open circuit between the second diode and a common node.

In some examples, the method includes providing the second current to a first resistor electrically connected in parallel with a first capacitor in response to the power supply voltage increasing beyond the second voltage threshold.

In some examples, the method includes providing the reset pulse to a delay circuit to extend a duration of the reset pulse. For example, the delay circuit can be one of the delay circuits described above. In some examples, the delay circuit includes at least two flip-flops and a capacitor, where the duration of the reset pulse is based on a discharge rate of the capacitor.

Among other advantages, the reset circuits and corresponding methods described herein may provide a reset pulse to one or more logic gates that allows the circuitry to stabilize during the power-up process before resetting. The reset circuits can create a reset pulse based on rise times of applied power, such as direct-current (DC) power, and subsequently generate a reset pulse with a longer duration. The duration and amplitude of the subsequently generated reset pulse are adjustable based on, for example, system performance and hardware requirements, thereby ensuring a proper reset of the hardware.

For example, the reset circuits and methods can provide a power-on detection circuit that uses analog circuitry to create an initial short-duration pulse. The initial short-duration pulse can then be used as a trigger to create a reset pulse (e.g., of positive polarity) of a much longer duration to enable logic circuitry, such as logic gates or memory, to stabilize during power-up conditions. These power-up conditions can include, for example, transient conditions affecting a power bus, such as a direct-current (DC) power bus. Persons of ordinary skill in the art can recognize additional advantages as well.

BRIEF DESCRIPTION OF THE DRAWINGS

The embodiments will be more readily understood in view of the following description when accompanied by the below figures, which are provided for illustrative purposes, wherein like numerals represent like elements, and wherein.

DETAILED DESCRIPTION

While the present disclosure is susceptible to various modifications and alternative forms, specific embodiments have been shown by way of example in the drawings and will be described in detail herein. It should be understood, however, that the present disclosure is not intended to be limited to the particular forms disclosed. Rather, the present disclosure is to cover all modifications, equivalents, and alternatives falling within the spirit and scope of the disclosure as defined by the appended claims.

Figure 3:
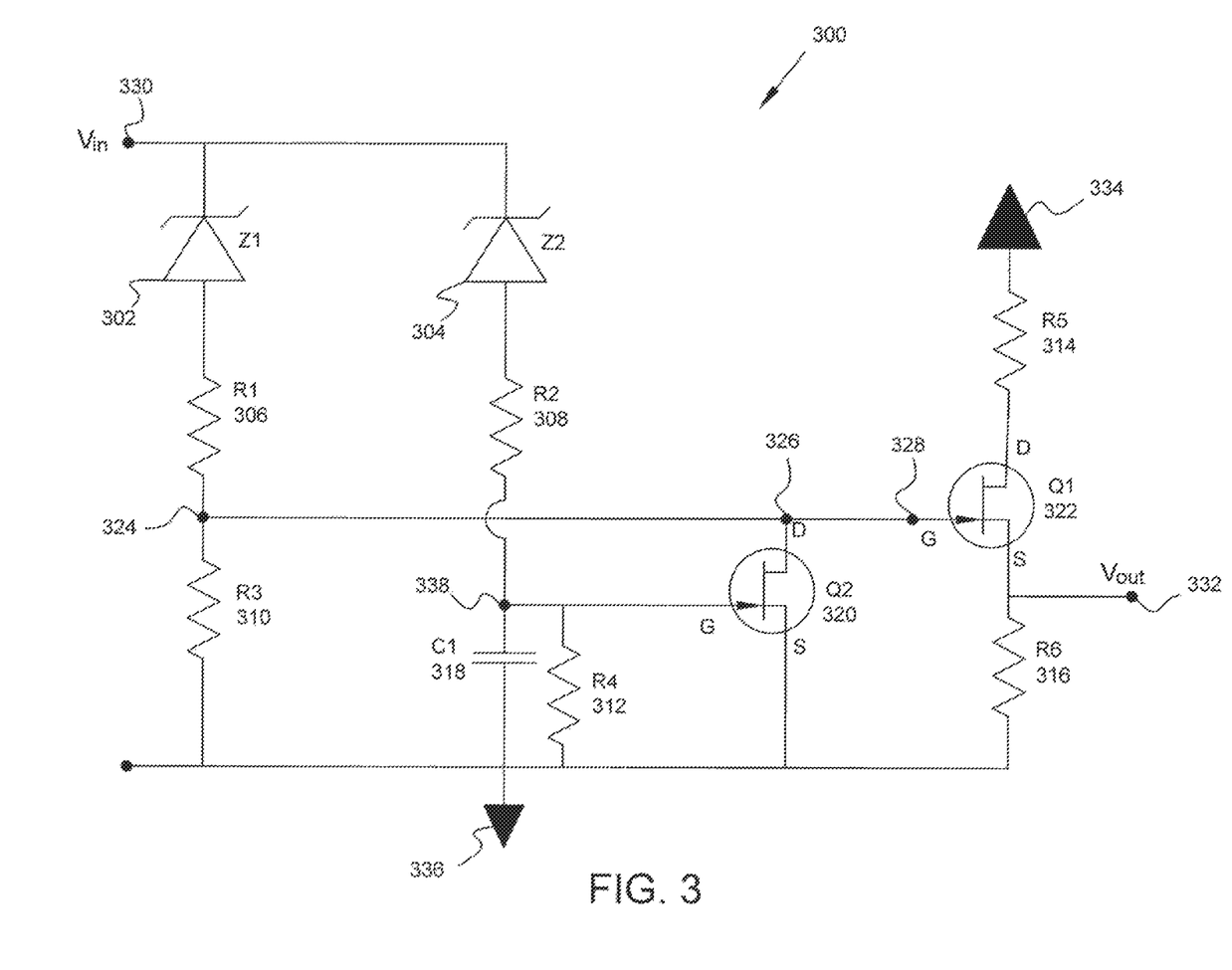
FIG. 3 is a schematic view of an electrical reset circuit that generates a reset pulse in accordance with some embodiments of the present disclosure.

FIG. 3 is a schematic view of one embodiment of an electrical reset circuit 300 that generates a reset pulse that can reset one or more $IC_S$ or any other suitable electronic components. Electrical reset circuit 300 includes diodes 302, 304, each electrically connected to power input $V_{in}$ 330. Diodes 302, 304 may each be a Zener diode, or any other equivalent type of diode. Electrical reset circuit 300 also includes transistor 322, 320, resistor 306, resistor 308, resistor 310, resistor 312, resistor 314, resistor 316, and capacitor 318.

In this example, during power-up, a voltage applied to power input yin 330 from a power source (e.g., a DC power source) may rise from one voltage (e.g., 0 Volts) to a maximum voltage (e.g., 28 Volts). As the voltage rises, each of diodes 302, 304 will begin to conduct current once their break-over voltages are reached. In this example, diode 302 is selected to have a lower break-over voltage than diode 304. For example, diode 302 may have a break-over voltage of 5.1 Volts while diode 304 may have a break-over voltage of 10 Volts. Thus, in this example, as the power input $V_{in}$ 330 voltage increases, diode 302 will begin to conduct current before diode 304.

When the power input $V_{in}$ 330 voltage reaches the break-over voltage of diode 302, current will begin to flow through resistor 306 and resistor 310, causing a voltage increase at node 324. The voltage increase at node 324, after reaching a minimum voltage amount, will cause the gate 328 of transistor 322 to activate (e.g., transistor 322 will gate on) and current will begin to flow from power rail 334, through resistor 314, transistor 322, and resistor 316 to ground 336. As a result, the voltage output at node $V_{out}$ 332 will increase, thus forming the rising edge of a reset pulse at node $V_{out}$ 332.

As the voltage continues to increase at power input $V_{in}$ 330 and the break-over voltage of diode 304 is reached, current will begin to flow across diode 304 and resistor 308, and current will also flow to the R-C network comprised of capacitor 318 and resistor 312. As a result, capacitor 318 will begin to charge. Based on the R-C time constants of capacitor 318 and resistor 312 (which depend on, inter alia, the values of capacitor 318 and resistor 312), the voltage at node 338 will increase beyond the minimum amount of voltage required to activate transistor 320. In one example, the values of capacitor 318 and resistor 312 are chosen such that the amount of time from when transistor 322 is activated to when transistor 320 is activated is between 50 micro-secs to 100 micro-secs. This time determines at least part of the reset pulse's duration. For example, the reset pulse may remain high at least until transistor 320 is activated.

As the voltage at node 338 continues to increase, it eventually increases beyond the minimum amount of voltage required to activate transistor 320. As such, transistor 320 will activate, and a current will begin to flow across transistor 320 from node 326 to ground 336. As such, the voltage at node 328 will drop, eventually deactivating (e.g., gating off) transistor 322. In other words, current flow across transistor 322 will decrease or stop. As a result, the voltage at node $V_{out}$ 332 drops (e.g., to 0 Volts), thereby creating a falling edge of the reset pulse at node $V_{out}$ 332. In one example, the rest pulse has a duration of 30 micro-secs to 100 micro-secs.

Although this example is described with respect to reset pulse at node $V_{out}$ 332 with a rising edge followed by a falling edge (e.g., active-high reset pulse), those of ordinary skill in the art having the benefit of these disclosures will appreciate that the reset pulse can instead be formed in other ways, such as with a falling edge followed by a rising edge (e.g., active-low reset pulse), or any other suitable way, without departing from the scope of these disclosures.

Figure 4:
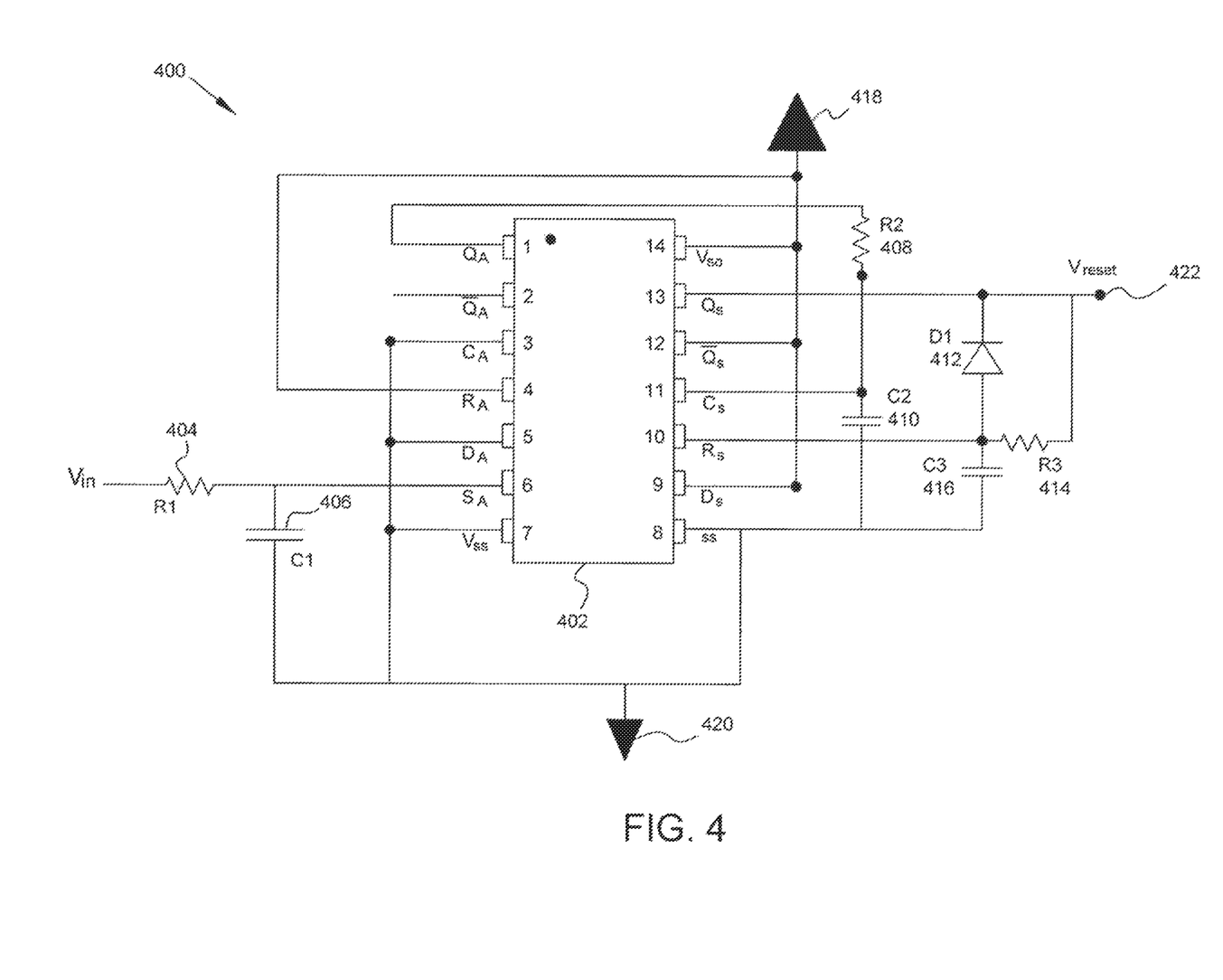
FIG. 4 is a schematic view of a delay circuit for a reset pulse in accordance with some embodiments of the present disclosure.

FIG. 4 is a schematic view of a delay circuit 400 that can delay, for example, the falling edge of reset pulse of FIG. 3. In this example, register 402 includes two flip-flops (not shown). Each flip-flop, as is recognized in the art, has an associated clock input signal ($C_A$, $C_S$), set input signal ($S_A$, $S_S$), reset input signal ($R_A$, $R_S$), data input signal ($D_A$, $D_S$), and output signals ($Q_A$, $\overline{Q}_A$, $Q_S$, $\overline{Q}_S$). In this example, signals associated with the letter "A" correspond to one flip-flop, and signals associated with the letter "S" correspond to a second flip-flop. As indicated in the figure, a voltage input $V_{in}$ is provided as set input signal $S_A$ via resistor 404. The signal received as voltage input $V_{in}$ is delayed via delay circuit 400, and is provided as a delayed signal, such as a delayed pulse signal, as $V_{reset}$ 422.

Delay circuit 400 includes capacitor 406 electrically connected to resistor 404 and to ground 420. Output signal $Q_A$ is electrically connected to clock input signal $C_S$ via resistor 408. In addition, clock input signal $C_S$ is also electrically connected to ground 420 via capacitor 410. Power rail 418 which, in one example, is a DC power rail supplying 8 to 15 Volts, is electrically connected to reset input signal $R_A$, voltage input $V_{SO}$, output signal $Q_S$, and data input signal $D_S$. In addition, diode 412 is electrically connected to output signal $Q_S$, reset input signal $R_S$, and to ground 420 via capacitor 416. Resistor 414 is electrically connected to diode 412 and capacitor 416.

In some examples, delay circuit 402 is configured to create a much longer reset pulse on $V_{reset}$ 422 (i.e., longer duration than pulse received on voltage input $V_{in}$) to ensure that logic gates have had time to stabilize after a power-on sequence. The resistor and capacitor values determine the duration of the longer reset pulse. For example, the delayed reset pulse can have a duration on the order of milli-seconds to seconds. In one example, resistor 404 is 10 kilo-ohms, capacitor 406 is 0.01 micro-Farads, resistor 408 is 100 kilo-ohms, capacitor 410 is 0.01 micro-Farads, capacitor 416 is 0.1 micro-Farads, resistor 414 is 500 kilo-ohms. Diode 412 can have a forward voltage of, for example, 1 Volt. In some embodiments, the amplitude of the delayed reset pulse can be adjusted by the use of a voltage divider circuit. For example, a voltage divider circuit can be added between output signal $Q_S$ and ground, such that the amplitude of the delayed circuit pulse signal at $V_{reset}$ is reduced.

Figure 5:
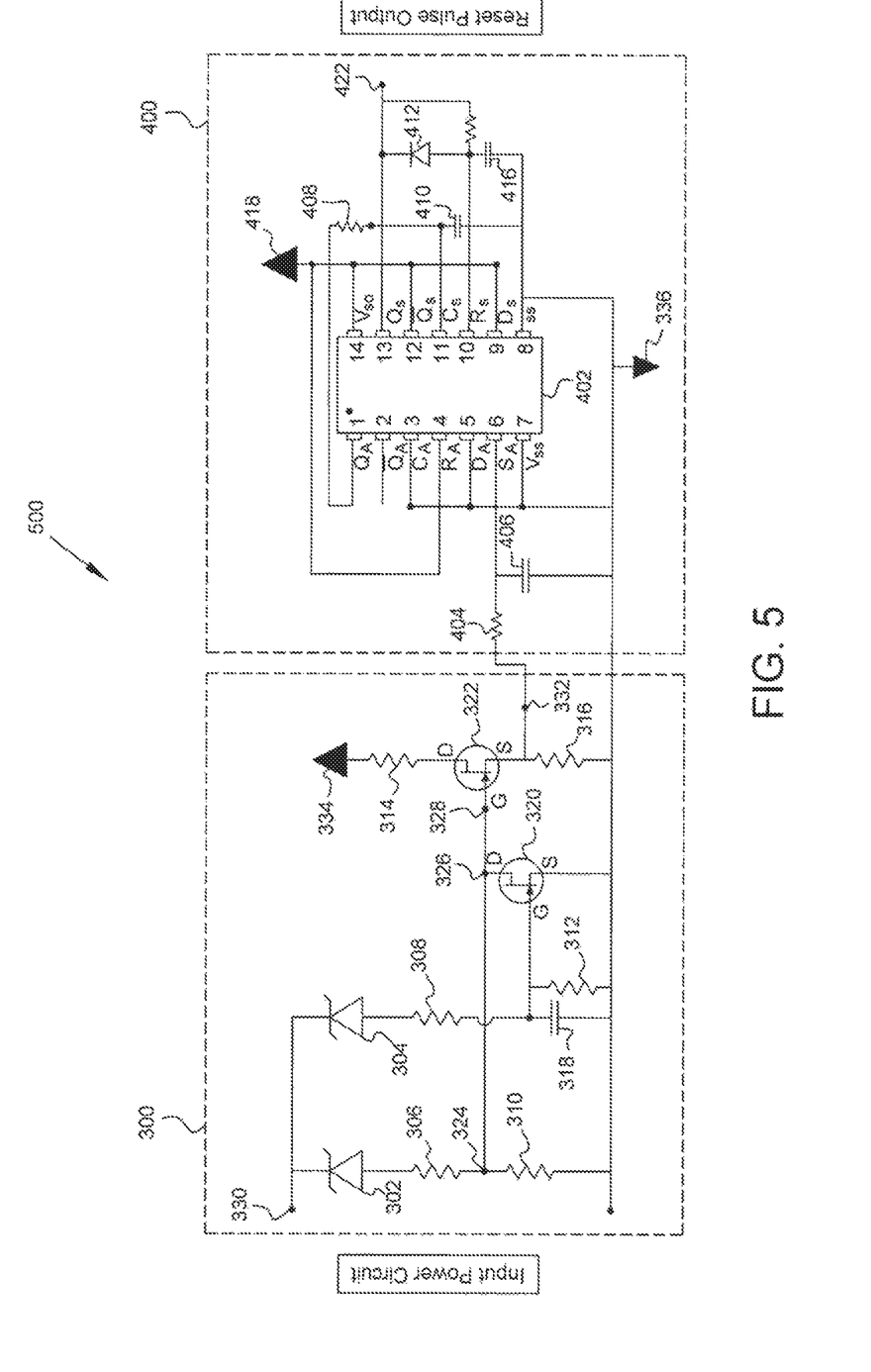
FIG. 5 is a schematic view of the electrical reset circuit of FIG. 3 electrically connected to the delay circuit of FIG. 4 in accordance with some embodiments of the present disclosure.

FIG. 5 is a schematic view of the electrical reset circuit 300 of FIG. 3 electrically connected to the delay circuit 400 of FIG. 4. The voltage output at node $V_{out}$ 332 is provided as voltage input $V_{in}$ to delay circuit 400. In some embodiments, electrical reset circuit 300 produces a reset pulse and provides it at node $V_{out}$ 332 to delay circuit 400. Based on the reset pulse, delay circuit 400 then provides a delayed reset pulse at $V_{reset}$ 422. The delayed reset pulse may be provided, for example, to one or more logic gates for resetting during a power-up sequence (e.g., during startup).

Figure 6:
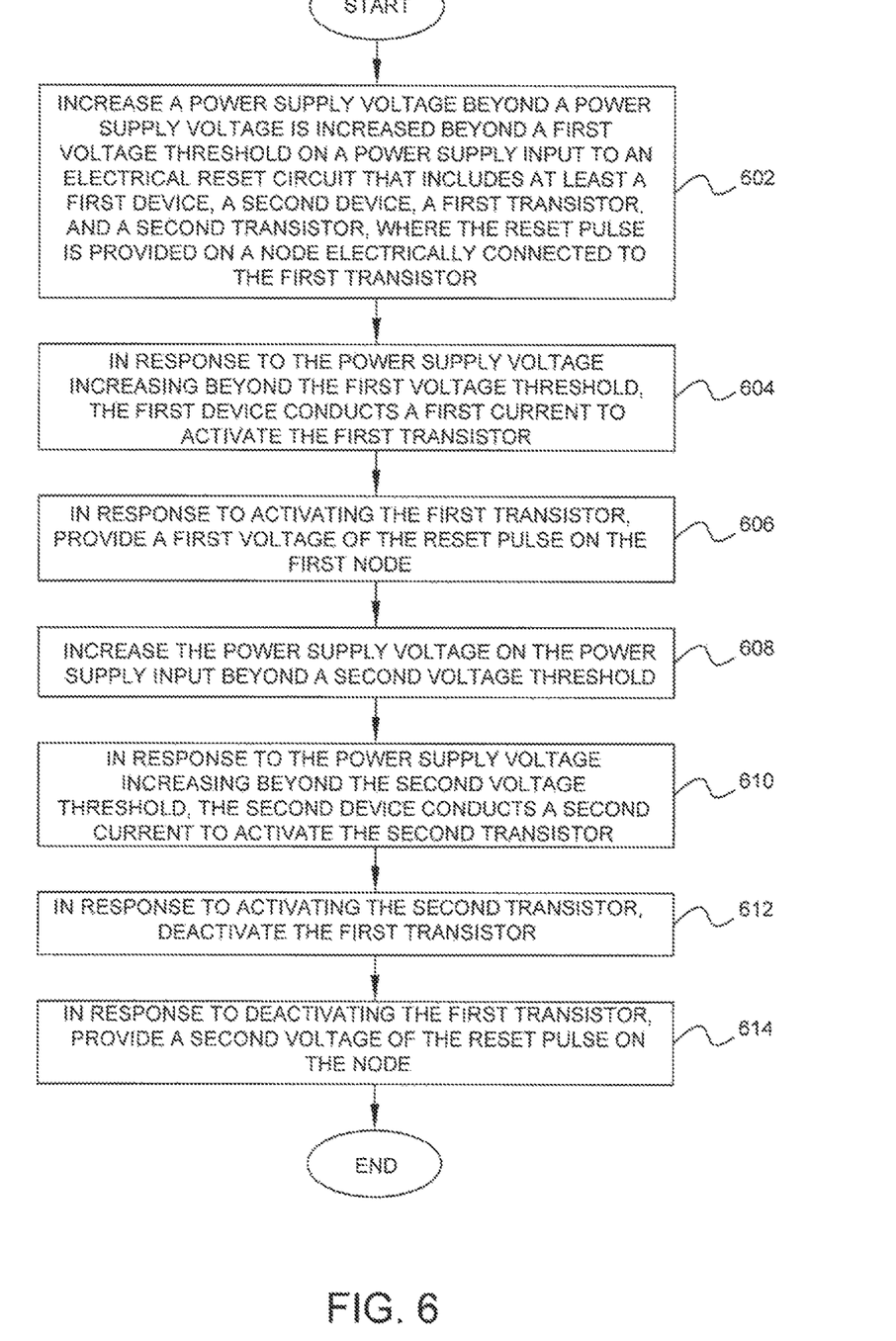
FIG. 6 is a flow diagram of a method to generate a reset pulse in accordance with some embodiments of the present disclosure.

FIG. 6 is a flow diagram of a method to generate a reset pulse, such as the reset pulse generated by the electrical reset circuit 300 of FIG. 3. At step 602, a power supply voltage is increased beyond a first voltage threshold on a power supply input to an electrical reset circuit that includes at least a first device, a second device, a first transistor, and a second transistor, where the reset pulse is provided on a node electrically connected to the first transistor. At step 604, in response to the power supply voltage increasing beyond the first voltage threshold, the first device conducts a first current to activate the first transistor. Proceeding to step 606, in response to activating the first transistor, a first voltage of the reset pulse is provided on the node. For example, the first voltage may include a rising edge of the reset pulse. At step 608, the power supply voltage on the power supply input is increased beyond a second voltage threshold. At step 610, in response to the power supply voltage increasing beyond the second voltage threshold, the second device conducts a second current to activate the second transistor. At step 612, in response to activating the second transistor, the first transistor is deactivated. At step 614, in response deactivating the first transistor, a second voltage of the reset pulse is provided on the node. For example, the second voltage may include a falling edge of the reset pulse. The method then completes.

Among other advantages, the reset circuits and corresponding methods described herein may provide a reset pulse to one or more logic gates that allows the circuitry to first stabilize during the power-up process. The reset circuits can create a reset pulse based on rise times of applied power, such as direct-current (DC) power, and subsequently generate a reset pulse with a longer duration. The duration and amplitude of the subsequently generated reset pulse are adjustable based on, for example, system performance and hardware requirements, thereby ensuring a proper reset of the hardware.

For example, the reset circuits and methods can provide a power-on detection circuit that uses analog circuitry to create an initial short-duration pulse. The initial short-duration pulse can then be used as a trigger to create a reset pulse (e.g., of positive polarity) of a much longer duration to enable logic circuitry, such as logic gates or memory, to stabilize during power-up conditions. These power-up conditions can include, for example, transient conditions affecting a power bus, such as a direct-current (DC) power bus. Persons of ordinary skill in the art can recognize additional advantages as well.

Although examples are illustrated and described herein, embodiments are nevertheless not limited to the details shown, since various modifications and structural changes may be made therein by those of ordinary skill within the scope and range of equivalents of the claims.

What is claimed:

1. An electrical reset circuit configured to generate a reset pulse, comprising:
    a first device electrically connected between a power supply input and a first node, wherein the first device is configured to conduct current after the power supply input reaches a first voltage threshold;
    a first resistor electrically connected between the first node and a common node;
    a second device electrically connected between the power supply input and a second node, wherein the second device is configured to conduct current after the power supply input reaches a second voltage threshold;
    a first capacitor electrically connected between the second node and the common node;
    a second resistor electrically connected in parallel with the first capacitor;
    a first transistor electrically connected between a power rail and the common node, wherein the gate of the first transistor is electrically connected to the first node; and
    a second transistor electrically connected between the first node and the common node, wherein the gate of the second transistor is electrically connected to the second node.

2. The electrical reset circuit of claim 1 further comprising a third resistor electrically connected between the first device and the first node.

3. The electrical reset circuit of claim 2 further comprising a fourth resistor electrically connected between the second device and the second node, and in series with the first capacitor and the second resistor.

4. The electrical reset circuit of claim 1 further comprising a third resistor electrically connected between the first transistor and the common node.

5. The electrical reset circuit of claim 4 further comprising a fourth resistor electrically connected between the power rail and the first transistor, wherein the fourth resistor, the first transistor, and the third resistor are electrically connected in series.

6. The electrical reset circuit of claim 1 further comprising a delay circuit electrically connected to the first transistor and configured to delay the reset pulse.

7. The electrical reset circuit of claim 6 wherein the delay circuit further comprises at least a first flip-flop and a second flip-flop, wherein a set input of the first flip-flop is electrically connected to the first transistor.

8. The electrical reset circuit of claim 7 wherein the delay circuit further comprises:
   a third resistor electrically connected between an output of the first flip-flop and a clock input of the first flip-flop; and
   a second capacitor electrically connected between the output of the first flip-flop and the common node.

9. The electrical reset circuit of claim 8 wherein the delay circuit further comprises:
   a diode electrically connected between an output of the second flip-flop and a reset input of the second flip-flop; and
   a third capacitor electrically connected between the reset input of the second flip-flop and the common node.

10. The electrical reset circuit of claim 9 wherein the delay circuit further comprises a fourth resistor electrically connected in parallel with the diode.

11. The electrical reset circuit of claim 1 wherein the first device and the second device are Zener diodes.

\* \* \* \* \*